(12) United States Patent
Ikebe et al.

(10) Patent No.: US 9,864,267 B2
(45) Date of Patent: Jan. 9, 2018

(54) REFLECTIVE MASK BLANK, REFLECTIVE MASK, AND METHOD FOR MANUFACTURING SEMICONDUCTOR DEVICE

(71) Applicant: HOYA CORPORATION, Tokyo (JP)

(72) Inventors: Yohei Ikebe, Tokyo (JP); Takahiro Onoue, Tokyo (JP); Tsutomu Shoki, Tokyo (JP)

(73) Assignee: HOYA CORPORATION, Shinjuku-ku, Tokyo (JP)

( * ) Notice: Subject to any disclaimer, the term of this patent is extended or adjusted under 35 U.S.C. 154(b) by 32 days.

(21) Appl. No.: 15/106,919

(22) PCT Filed: Nov. 26, 2014

(86) PCT No.: PCT/JP2014/081153
§ 371 (c)(1),
(2) Date: Jun. 21, 2016

(87) PCT Pub. No.: WO2015/098400
PCT Pub. Date: Jul. 2, 2015

(65) Prior Publication Data
US 2017/0038673 A1    Feb. 9, 2017

(30) Foreign Application Priority Data

Dec. 25, 2013  (JP) ................................ 2013-266982

(51) Int. Cl.
*G03F 1/24*    (2012.01)
*G03F 1/26*    (2012.01)
(Continued)

(52) U.S. Cl.
CPC ............. *G03F 1/24* (2013.01); *G03F 1/26* (2013.01); *G03F 1/38* (2013.01); *G03F 1/48* (2013.01);
(Continued)

(58) Field of Classification Search
None
See application file for complete search history.

(56) References Cited

U.S. PATENT DOCUMENTS

| 2009/0130569 A1 | 5/2009 | Quesnel |
| 2009/0220869 A1 | 9/2009 | Takai |

(Continued)

FOREIGN PATENT DOCUMENTS

| JP | 2005-268750 A | 9/2005 |
| JP | 2008-539573 A | 11/2008 |

(Continued)

OTHER PUBLICATIONS

International Search Report of PCT/JP2014/081153 dated Feb. 10, 2015.

*Primary Examiner* — Stephen Rosasco
(74) *Attorney, Agent, or Firm* — Sughrue Mion, PLLC (57) ABSTRACT

To provide a reflective mask blank which may inhibit a variation in reflectance with respect to EUV light due to counter diffusion between a protective film and a material of an adjacent phase-shift film pattern caused by thermal diffusion even if the power of an exposure light source of an EUV exposure machine becomes high; a reflective mask manufactured therefrom; and a method for manufacturing a semiconductor device. The reflective mask blank comprises a multilayer reflective film 13, protective film 14, and phase-shift film 16 for shifting a phase of the EUV light, which are formed in said order on a substrate 12. The protective film 14 is made of a material containing ruthenium as a main component, the phase-shift film 16 has a tantalum-based material layer comprising tantalum, and an anti-diffusion layer 15 comprising ruthenium and oxygen is formed on a surface of the protective film 14, or as a part of the protective film 14 on a side adjacent to the phase-shift layer 16, so as to inhibit counter diffusion in relation to the phase-shift film 16, thereby inhibiting the thermal diffusion between the protective film 14 and the material of the phase-shift film pattern.

12 Claims, 6 Drawing Sheets

(51) Int. Cl.
*G03F 1/48* (2012.01)
*G03F 1/38* (2012.01)
*G03F 7/20* (2006.01)
C23C 14/06 (2006.01)
C23C 14/18 (2006.01)

(52) U.S. Cl.
CPC ........ *G03F 7/2004* (2013.01); *C23C 14/0641* (2013.01); *C23C 14/185* (2013.01)

(56) References Cited

U.S. PATENT DOCUMENTS

| | | |
|---|---|---|
| 2010/0136464 A1 | 6/2010 | Hosoya |
| 2014/0091467 A1* | 4/2014 | Jezewski ........... H01L 23/53238 257/751 |
| 2014/0170533 A1* | 6/2014 | Sun .......................... G03F 1/22 430/5 |

FOREIGN PATENT DOCUMENTS

| | | |
|---|---|---|
| JP | 2009-212220 A | 9/2009 |
| JP | 2010-80659 A | 4/2010 |
| JP | 2010-92947 A | 4/2010 |
| JP | 2012-151368 A | 8/2012 |

* cited by examiner

REFLECTIVE MASK BLANK, REFLECTIVE MASK, AND METHOD FOR MANUFACTURING SEMICONDUCTOR DEVICE

CROSS REFERENCE TO RELATED APPLICATIONS

This application is a National Stage of International Application No. PCT/JP2014/081153 filed Nov. 26, 2014, claiming priority based on Japanese Patent Application No. 2013-266982, filed Dec. 25, 2013, the contents of all of which are incorporated herein by reference in their entirety.

TECHNICAL FIELD

The present invention relates to a reflective mask blank that is a master copy for manufacturing an exposure mask used in, for example, the manufacture of a semiconductor device; a reflective mask manufactured from the reflective mask blank; and a method for manufacturing a semiconductor device.

BACKGROUND ART

Types of light sources for exposure apparatuses used in the manufacture of semiconductors have evolved from g-line with a wavelength of 436 nm, through i-line with a wavelength of 365 nm and a KrF laser with a wavelength of 248 nm, into an ArF laser with a wavelength of 193 nm, gradually shortening the wavelengths. Also, EUV lithography using extreme ultraviolet (EUV) with a wavelength of about 13.5 nm has been offered in order to achieve the finer pattern transfer. In the EUV lithography, a reflective mask is used partly because a difference in absorptivity of EUV light between materials is small. For example, a reflective mask, in which a multilayer reflective film for reflecting exposure light is formed on a substrate and a phase-shift film for absorbing the exposure light is formed in a pattern on a protective film for protecting the multilayer reflective film, has been proposed. The light incident on the reflective mask mounted on an exposure machine (pattern transfer apparatus) is absorbed at a region where the phase-shift film pattern exists, and is reflected by the multilayer reflective film at a region where the phase-shift film pattern does not exist, such that an optical image is transferred onto a semiconductor substrate through a catoptric system. In the phase-shift film pattern, some of the incident exposure light is reflected with a phase difference of about 180 degrees with respect to the light reflected by the multilayer reflective film (phase shift), thereby achieving the contrast.

The technique related to reflective masks for EUV lithography and mask blanks for manufacturing the reflective masks is disclosed in, for example, Patent Documents 1 to 4.

PRIOR ART DOCUMENTS

Patent Documents

Patent Document 1: Japanese Patent Application Publication 2010-080659
Patent Document 2: Japanese Patent Application Publication 2009-212220
Patent Document 3: Japanese Patent Application Publication 2005-268750
Patent Document 4: Japanese Patent Application Publication 2010-092947

SUMMARY OF THE INVENTION

Problems to be Solved by the Invention

An EUV exposure machine is a technology which has not been fully commercialized yet, and the power of an exposure light source suitable for research and development is selected for the EUV exposure machine (a light source of about 15 W is currently used). However, in order to commercialize the EUV exposure machine on a full scale, a throughput above a certain level should be obtained. In order to achieve such a throughput, the power of the exposure light source should be increased. When the power of the exposure light source becomes high, a heating value per unit time in the reflective mask upon the exposure (pattern transfer) is increased (since the energy of light absorbed by the phase-shift film is converted into heat), and thus, thermal diffusion due to the heat causes counter diffusion between the protective film and a material of the adjacent phase-shift film pattern. Such counter diffusion causes a variation in reflectance with respect to the EUV light, and thus, the function as a reflective mask may be lowered due to repeated use (the contrast as designed may not be obtained).

In view of the above, the object of the present invention is to provide a reflective mask blank which may inhibit a variation in reflectance with respect to EUV light due to counter diffusion between a protective film and a material of an adjacent phase-shift film pattern caused by thermal diffusion even if the power of an exposure light source of an EUV exposure machine becomes high; a reflective mask manufactured from the reflective mask blank; and a method for manufacturing a semiconductor device.

Means for Solving the Problems

The present invention has the following configurations in order to solve the above problems.
(Configuration 1)
A reflective mask blank comprising:
a substrate, and
a multilayer reflective film, a protective film, and a phase-shift film for shifting a phase of EUV light, which are formed in said order on the substrate,
wherein the protective film is made of a material containing ruthenium as a main component,
wherein the phase-shift film has a tantalum-based material layer comprising tantalum, and
wherein an anti-diffusion layer comprising ruthenium and oxygen is formed on a surface of the protective film, or as a part of the protective film on a side adjacent to the phase-shift layer, so as to inhibit counter diffusion in relation to the phase-shift film.
(Configuration 2)
The reflective mask blank according to Configuration 1, wherein the tantalum-based material layer is adjacent to the anti-diffusion layer.
(Configuration 3)
The reflective mask blank according to Configuration 1 or 2, wherein a thickness of the anti-diffusion layer is not less than 0.2 nm and not more than 1.5 nm.
(Configuration 4)
The reflective mask blank according to any one of Configurations 1 to 3, wherein the phase-shift film is formed in a laminated structure, and has a chromium-based material layer as an outermost surface layer.
(Configuration 5)
The reflective mask blank according to Configuration 4, wherein the chromium-based material layer comprises carbon.
(Configuration 6)
The reflective mask blank according to any one of Configurations 1 to 3, wherein the phase-shift film is formed in a laminated structure, and has a ruthenium-based material layer as an outermost surface layer.
(Configuration 7)
The reflective mask blank according to any one of Configurations 1 to 6, wherein the phase-shift film is formed by a sputtering method, and has a laminated structure formed continuously without exposure to the atmosphere from the beginning to the end of film formation.
(Configuration 8)
The reflective mask blank according to any one of Configurations 1 to 7, wherein an etching mask film is formed on the phase-shift film.
(Configuration 9)
The reflective mask blank according to any one of Configurations 1 to 8, wherein an uppermost layer of the multilayer reflective film is silicon (Si), and a silicon oxide layer comprising silicon and oxygen is provided between the uppermost layer and the protective film.
(Configuration 10)
A reflective mask manufactured from the reflective mask blank according to any one of Configurations 1 to 9.
(Configuration 11)
A method for manufacturing a semiconductor device, comprising the step of:
setting the reflective mask according to Configuration 10 on an exposure apparatus having an exposure light source for emitting EUV light, so as to transfer a transfer pattern onto a resist film formed on a transfer target substrate.
(Configuration 12)
The method for manufacturing a semiconductor device according to Configuration 11, wherein the power (electric power) of the exposure light source is 80 W or more.

Effect of the Invention

According to a reflective mask blank (and a reflective mask manufactured therefrom) of the present invention, since an anti-diffusion layer comprising ruthenium and oxygen is formed on a surface of a protective film, or as a part of the protective film on a side adjacent to a phase-shift layer, counter diffusion between the protective film and phase-shift film (absorber film) due to thermal diffusion is inhibited even under a usage environment where the power of an exposure light source of an EUV exposure machine is high, and thus, a reduction in EUV light reflectance is inhibited. Therefore, a reflective mask in which a reduction in phase-shift effect is inhibited may be obtained. Further, according to the present invention, it is possible to provide a method for manufacturing a semiconductor device, with the reduction in phase-shift effect in a reflective mask being inhibited.

MODES FOR CARRYING OUT THE INVENTION

Figure 1:
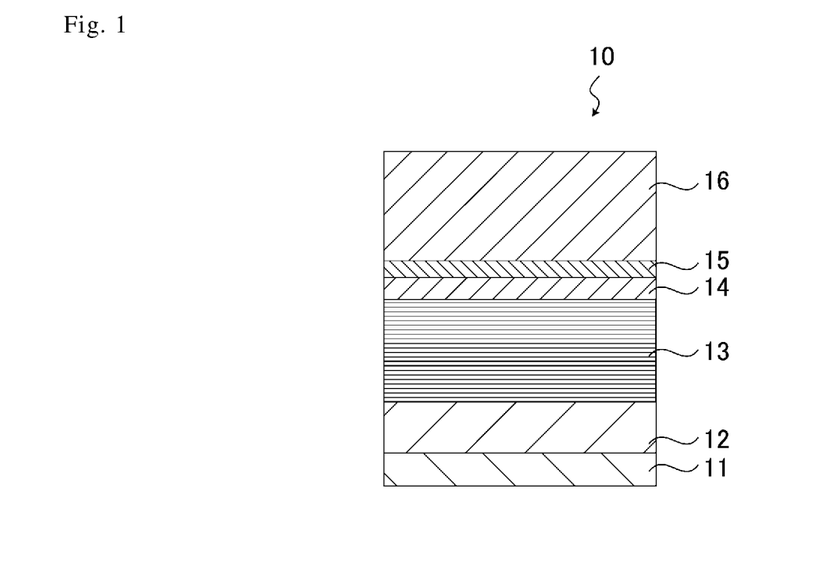
FIG. 1 is a view for illustrating a schematic configuration of a reflective mask blank for EUV lithography according to the present invention.

Embodiments of the present invention are particularly described below with reference to the drawings. Each of the embodiments below is merely one configuration for embodying the present invention, and is not intended to limit the present invention to its extent.
<Configuration and Manufacturing Method of Reflective Mask Blank>
FIG. 1 is a diagrammatic view for illustrating a configuration of a reflective mask blank for EUV lithography according to the present invention. As shown in FIG. 1, the reflective mask blank 10 comprises a substrate 12, a multilayer reflective film 13 reflecting EUV light as exposure light, a Ru-based protective film 14 made of a material containing ruthenium as a main component for protecting the multilayer reflective film 13, an anti-diffusion layer 15 made of a material containing ruthenium and oxygen, and a phase-shift film 16 absorbing the EUV light and reflecting some of the EUV light to shift its phase, which are laminated in said order. A back side conductive film 11 for an electrostatic chuck is formed on the back side of the substrate 12.
These layers are described below respectively.
<<Substrate>>
The substrate 12 preferably has a low thermal expansion coefficient within a range of 0±5 ppb/° C. in order to prevent a strain in an absorber film pattern due to the heat upon the exposure to the EUV light. A material having the low thermal expansion coefficient within the above range includes, for example, $SiO_2$—$TiO_2$-based glass, multicomponent glass ceramics, etc.
A main surface of the substrate 12 on the side where a transfer pattern (comprised of a phase-shift film described below) is to be formed is processed so as to have high flatness in terms of the acquisition of at least pattern transfer accuracy and positional accuracy. In the case of EUV exposure, the flatness in a region of 132 mm×132 mm on the main surface of the substrate 12 on the side where the transfer pattern is to be formed is preferably 0.1 μm or less, further preferably 0.05 μm or less, and especially preferably 0.03 μm or less. A main surface opposite to the side where the phase-shift film is to be formed is electrostatically chucked when the substrate is set on the exposure apparatus, and the flatness in its region of 142 mm×142 mm is preferably 1 μm or less, further preferably 0.5 μm or less, and especially preferably 0.3 μm or less. The flatness herein is a value showing a curvature (deformation amount) of the surface, indicated by TIR (Total Indicated Reading). Assuming that a plane defined by a least squares method based on the substrate surface is a focal plane, the flatness is an absolute value of height difference between the highest position of the substrate surface above the focal plane and the lowest position of the substrate surface below the focal plane.

In the EUV exposure, surface smoothness required for the substrate 12 is preferably such that surface roughness of the main surface of the substrate 12 on the side where the transfer pattern is to be formed is 0.1 nm or less in root mean square roughness (RMS). The surface smoothness may be measured with an atomic force microscope.

Further, the substrate 12 preferably has high rigidity in order to prevent the deformation due to film stress of a film formed thereon (such as the multilayer reflective film 13). In particular, it preferably has a high Young's modulus of 65 GPa or more.

<<Multilayer Reflective Film>>

The multilayer reflective film 13 provides a function for reflecting the EUV light with the reflective mask for EUV lithography, and has a multi-layered film structure in which elements having different refractive indices are periodically laminated.

Generally, the multilayer reflective film 13 is a multi-layered film, in which a thin film (high refractive index layer) made of a light element or a compound thereof that is a high refractive index material and a thin film (low refractive index layer) made of a heavy element or a compound thereof that is a low refractive index material are alternately laminated in about 40 to 60 periods. Assuming that a high refractive index layer/low refractive index layer-laminated structure, in which a high refractive index layer and a low refractive index layer are laminated in said order from the substrate 12 side, is regarded as one period, the multi-layered film may be formed by laminating the laminated structures in a plurality of periods. Alternatively, assuming that a low refractive index layer/high refractive index layer-laminated structure, in which a low refractive index layer and a high refractive index layer are laminated in said order from the substrate 12 side, is regarded as one period, the multi-layered film may be formed by laminating the laminated structures in a plurality of periods. The outermost surface layer of the multilayer reflective film 13, i.e., a surface layer of the multilayer reflective film 13 opposite to the substrate 12, is preferably a high refractive index layer. When the high refractive index layer/low refractive index layer-laminated structure, in which a high refractive index layer and a low refractive index layer are laminated in said order from the substrate 12, is regarded as one period, and the multi-layered film is formed by laminating the laminated structures in a plurality of periods, the uppermost layer is a low refractive index layer. If the low refractive index layer constitutes the outermost surface of the multilayer reflective film 13, it is easily oxidized to reduce the reflectance of the reflective mask. Thus, in this case, another high refractive index layer is preferably further formed on the uppermost low refractive index layer to provide the multilayer reflective film 13. On the other hand, when the low refractive index layer/high refractive index layer-laminated structure, in which a low refractive index layer and a high refractive index layer are laminated in said order from the substrate 12 side, is regarded as one period, and the multi-layered film is formed by laminating the laminated structures in a plurality of periods, the uppermost layer is a high refractive index layer, and thus, that is fine as it is.

In this embodiment, a layer containing Si is used as the high refractive index layer. A material containing Si may be a Si simple substance, as well as a Si compound containing Si and B, C, N, or O. By using the layer containing Si as the high refractive index layer, a reflective mask for EUV lithography having a superior reflectance of the EUV light may be obtained. Further, while a glass substrate is preferably used as the substrate 12 in this embodiment, Si also has superior adhesion to the glass substrate. A metal simple substance selected from Mo, Ru, Rh, and Pt, or an alloy thereof may be used as the low refractive index layer. For example, as the multilayer reflective film 13 for the EUV light with a wavelength of 13 to 14 nm, a periodically laminated Mo/Si film, which is formed by alternately laminating Mo and Si films in about 40 to 60 periods, is preferably used. The high refractive index layer that is the uppermost layer of the multilayer reflective film 13 may be formed from silicon (Si), and a silicon oxide layer comprising silicon and oxygen may be formed between the uppermost layer (Si) and Ru-based protective film 14. This may improve a mask cleaning resistance (resistance to film peeling in the phase-shift film pattern).

The reflectance of this multilayer reflective film 13 alone is generally 65% or more, and its upper limit is generally 73%. The thickness of each constitutive layer and periods for the multilayer reflective film 13 may be appropriately selected depending on the exposure wavelength, and are selected so as to satisfy the Bragg's law. While the multilayer reflective film 13 comprises a plurality of high refractive index layers and a plurality of low refractive index layers, the plurality of high refractive index layers may not have the same thickness, and the plurality of low refractive index layers may not have the same thickness. The thickness of the outermost surface Si layer of the multilayer reflective film 13 may be adjusted as long as the reflectance is not lowered. The thickness of the outermost surface Si layer (high refractive index layer) may be 3 to 10 nm.

While a method for forming the multilayer reflective film 13 is publicly known in the art, it may be formed by forming respective layers using, for example, an ion beam sputtering method. In the above described Mo/Si periodic multi-layered film, for example, by the ion beam sputtering method, a Si target is used to form a Si film having a thickness of about 4 nm on the substrate 12, and then, a Mo target is used to form a Mo film having a thickness of about 3 nm. These Si and Mo films, regarded as one period, are laminated in 40 to 60 periods, so as to form the multilayer reflective film 13 (the outermost surface layer is a Si layer).

<<Ru-Based Protective Film>>

The Ru-based protective film 14 is formed on the multilayer reflective film 13 in order to protect the multilayer reflective film 13 from dry etching or cleaning in the manufacturing process for the reflective mask for EUV lithography described below. The Ru-based protective film 14 is made of a material containing ruthenium as a main component (main component: 50 at % or more), which may be a Ru metal simple substance, or a Ru alloy containing Ru and metal such as Nb, Zr, Y, B, Ti, La, Mo, Co, or Re, and which may contain nitrogen. The Ru-based protective film 14 may be a laminated structure comprising three or more layers. In this structure, the lowermost layer and uppermost layer may be made of a substance containing Ru described above, and a metal other than Ru, or an alloy thereof may be interposed between the lowermost layer and uppermost layer.

There is no particular limitation on the thickness of the Ru-based protective film 14 comprised of, for example, Ru or its alloy as long as it can fulfill a function as a protective film. However, in view of the EUV light reflectance, it is preferably 1.5 to 8.0 nm, and more preferably 1.8 to 6.0 nm.

A method similar to the publicly-known film forming method may be used as a method for forming the Ru-based protective film 14 without particular limitation. Specifically, it may include the sputtering method and ion beam sputtering method.

<<Phase-Shift Film>>

The phase-shift film 16 is formed above the Ru-based protective film 14, with an anti-diffusion layer 15 described below provided therebetween. The phase-shift film 16 absorbs the EUV light and reflects some of the EUV light so as to shift the phase. That is, in the reflective mask in which the phase-shift film 16 has been patterned, a region where the phase-shift film 16 is left absorbs the EUV light and reflects some of the EUV light not to affect the pattern transfer, so as to generate a phase difference from the light reflected from the multilayer reflective film 13. The phase-shift film 16 is formed such that the reflectance with respect to the EUV light is 1 to 30% and the phase difference between the light reflected from the phase-shift film 16 and the light reflected from the multilayer reflective film 13 is 170 to 190 degrees. The thickness of the phase-shift film 16 may be appropriately determined depending on the material used and a designed value of the reflectance and so as to achieve the condition under which the phase difference falls within the above range.

There is no particular limitation on a material for the phase-shift film 16 as long as it has a function to absorb the EUV light and can be removed by, for example, etching. In this embodiment, in view of etching selectivity, etc., a tantalum simple substance, or a tantalum-based material containing tantalum is used. The tantalum-based material may be a TaB alloy containing Ta and B, a TaSi alloy containing Ta and Si, a Ta alloy containing Ta and other transition metals (e.g., Pt, Pd, and Ag), or a tantalum-based compound made by adding N, O, H, or C to the Ta metal or its alloy.

The phase-shift film 16 comprised of tantalum or a tantalum compound may be formed by a publicly-known method, such as sputtering methods including a DC sputtering method or RF sputtering method.

A crystalline state of the phase-shift film 16 is preferably an amorphous or microcrystalline structure in terms of smoothness. If the phase-shift film 16 is not smooth, edge roughness of the phase-shift film pattern is increased, which may reduce the dimension accuracy of the pattern. The surface roughness of the phase-shift film 16 is preferably 0.5 nmRMS or less, more preferably 0.4 nmRMS or less, and further preferably 0.3 nmRMS or less.

Since Ta has a high absorption coefficient for the EUV light, and may be easily dry etched with a chlorine-based gas or fluorine-based gas, it is a phase-shift film material having excellent processability. Further, by adding B, Si, Ge, etc. to Ta, an amorphous material may be easily obtained, and the smoothness of the phase-shift film 16 may be improved. The addition of N or O to Ta improves the resistance to oxidation in the phase-shift film 16, which gives an effect of improvement in stability over time.

As further clarified in the description of examples below, the phase-shift film 16 includes one made of the tantalum-based material layer alone, as well as one formed by laminating the tantalum-based material layer and other material layers. Specifically, other material layers are a chromium-based material layer and ruthenium-based material layer. The chromium-based material may be a Cr simple substance, a Cr alloy containing Cr and other transition metals (e.g., Pt, Pd, and Ag), or a chromium-based compound made by adding N, O, H, C, etc. to the Cr metal or Cr alloy. The ruthenium-based material may be a Ru metal simple substance, or a Ru alloy containing Ru and metal such as Nb, Zr, Y, B, Ti, La, Mo, Co, and Re. It may be a ruthenium-based compound made by adding N, O, H, C, etc. to the Ru metal or its alloy. If the phase-shift film 16 is formed to have a laminated structure of the tantalum-based material layer and other material layers (other material layers are laminated onto the tantalum-based material layer), it is preferably formed continuously without exposure to the atmosphere from the beginning to the end of film formation. This may prevent an oxidized layer (tantalum oxide layer) from being formed on a surface of the tantalum-based material layer 161 (thereby eliminating the step for removing the tantalum oxide layer).

There is no particular limitation on the order and amount of lamination for the tantalum-based material layer and chromium-based material layer in the phase-shift film 16. For example, the phase-shift film 16 may have a two-layer structure of Ta/Cr, a two-layer structure of Cr/Ta, a three-layer structure of Ta/Cr/Ta, a three-layer structure of Cr/Ta/Cr, a four-layer structure of Ta/Cr/Ta/Cr, a four-layer structure of Cr/Ta/Cr/Ta, a four-layer structure of Ta/Ta/Cr/Cr, a four-layer structure of Cr/Cr/Ta/Ta, etc., and the other structures, wherein the order of the Ta and Cr layers are as viewed from the substrate 12 side. However, as shown in examples below, it is more preferable that the material adjacent to the anti-diffusion layer 15 is the tantalum-based material layer and that the outermost surface layer of the phase-shift film 16 is the chromium-based material layer. This is because such a configuration causes the chromium-based material layer to also have a function as an anti-oxidation film for the tantalum-based material layer (the oxidation and reduction in etching rate caused if Ta is provided as the uppermost layer may be inhibited). Further, if the chromium-based material layer is provided as the outermost surface layer of the phase-shift film 16, it is more preferably made of a material containing carbon, in particular, CrC, CrCO, CrCN, CrCON, CrCH, CrCOH, CrCHN, and CrCONH, in terms of chemical resistance upon mask cleaning. Ta and Cr include their nitrides, oxides, or alloys in addition to single metals, and thus, Ta layers and Cr layers in the phase-shift film 16 may not comprise the same material or composition, respectively.

There is also no particular limitation on the order and amount of lamination for the tantalum-based material layer and ruthenium-based material layer in the phase-shift film 16. For example, the phase-shift film 16 may have a two-layer structure of Ta/Ru, a three-layer structure of Ta/Ru/Ta, a four-layer structure of Ta/Ru/Ta/Ru, a four-layer structure of Ta/Ta/Ru/Ru, etc., and the other structures, wherein the order of the Ta and Ru layers are as viewed from the substrate 12 side. However, as shown in examples below, it is more preferable that the material adjacent to the anti-diffusion layer 15 is the tantalum-based material layer and that the outermost surface layer of the phase-shift film 16 is the ruthenium-based material layer. Such a configuration causes the ruthenium-based material layer to also have a function as an anti-oxidation film for the tantalum-based material layer. Ta and Ru include their nitrides, oxides, or alloys in addition to single metals, and thus, Ta layers and Ru layers in the phase-shift film 16 may not comprise the same material or composition, respectively.

Further, the tantalum-based material layer, ruthenium-based material layer, and chromium-based material layer may be laminated in the phase-shift film 16, and there is also no particular limitation on the order and amount of lamination. For example, the phase-shift film 16 may have a three-layer structure of Ta/Ru/Cr, a three-layer structure of Ta/Cr/Ru, etc., and the other structures, wherein the order of the Ta, Ru, and Cr layers are as viewed from the substrate 12 side.

<<Anti-Diffusion Layer>>

The present invention is intended to inhibit the counter diffusion between the Ru-based protective film 14 and the material of the adjacent phase-shift film pattern (phase-shift film 16) of the reflective mask which occurs due to the thermal diffusion, and the resultant variation in EUV light reflectance even if the power of the exposure light source in the EUV exposure machine becomes high. As a measure to overcome the above situation, the anti-diffusion layer 15 is provided on a surface of the Ru-based protective film 14, or as a part of the Ru-based protective film 14 on the side adjacent to the phase-shift film 16. With the formation of the anti-diffusion layer 15, even under the usage environment where the power of the exposure light source in the EUV exposure machine is high, the counter diffusion between the protective film and phase-shift film due to the thermal diffusion may be inhibited, and thus, the reduction of the EUV light reflectance may be inhibited, such that the reduction in phase-shift effect is inhibited even if the reflective mask is repeatedly used.

The anti-diffusion layer 15 is formed from a material containing ruthenium (Ru) and oxygen (O). The material only has to contain Ru and O, and may contain N or H as well. Ru may be a Ru metal simple substance or a Ru alloy (the same material system as the protective film material is preferable). For example, if the protective film is Ru, the material for the anti-diffusion layer 15 may be RuO, RuON, or the like. If the protective film is a Ru alloy (e.g., RuNb), the material for the anti-diffusion layer 15 may be RuNbO, RuNbON, or the like. In terms of the inhibition of the counter diffusion due to the thermal diffusion, and the reflectance with respect to the EUV light, the ratio of ruthenium (Ru) and oxygen (O) in the anti-diffusion layer 15 (at %) is desirably set such that when the ratio of Ru is 1, O is not less than 0.8 and not more than 2.2, and preferably not less than 1.0 and not more than 2.0.

The anti-diffusion layer 15 may be formed or generated by a sputtering method (ion beam sputter, DC sputter, and RF sputter), or by annealing the surface of the Ru-based protective film 14 in the atmosphere, oxygen gas atmosphere, or ozone gas atmosphere. If the anti-diffusion layer 15 is laminated on the Ru-based protective film 14 by the sputtering method, it may be formed by freely selecting a material as illustrated above. On the other hand, if the anti-diffusion layer 15 is formed by annealing the surface of the Ru-based protective film 14, it becomes an oxidized film, etc. based on the material of the Ru-based protective film 14. In the case of lamination by the sputtering method, the anti-diffusion layer 15 is newly laminated on the Ru-based protective film 14 (the film thickness is increased). However, in the case of the annealing of the surface of the Ru-based protective film 14, the entire film thickness is not increased, but a portion of the Ru-based protective film 14 (which contacts the phase-shift film 16) has the function of the anti-diffusion layer 15.

The thickness of the anti-diffusion layer 15 is preferably not less than 0.2 nm and not more than 1.5 nm in terms of the effect of inhibiting the thermal diffusion and the reflectance property with respect to the EUV light. The thickness of less than 0.2 nm is not preferable because the effect of inhibiting the thermal diffusion is not sufficiently exhibited. The thickness of more than 1.5 nm is also not preferable because the reflectance with respect to the EUV light is below 63%. The thickness is more preferably not less than 0.3 nm and not more than 1.2 nm, and further preferably not less than 0.5 nm and not more than 1.0 nm.

<<Back Side Conductive Film>>

A back side conductive film 11 for electrostatic chuck is formed on the back side of the substrate 12 (opposite to the surface on which the multilayer reflective film 13 is formed). An electrical characteristic required of the back side conductive film 11 for electrostatic chuck is generally 100 Ω/sq or less. The back side conductive film 11 may be formed, for example, using a target of metal such as chromium or tantalum, or an alloy thereof by a magnetron sputtering method or ion beam sputtering method. While there is no particular limitation on a thickness of the back side conductive film 11 as long as it satisfies the function suitable for the electrostatic chuck, it is generally 10 to 200 nm.

The configurations of the respective layers of the reflective mask blank 10 according to this embodiment are described above. As further clarified in the description of examples below, the reflective mask blank may comprise an etching mask film or resist film on the phase-shift film 16. A representative material for the etching mask film may include silicon (Si), or a material formed by adding oxygen, nitrogen, carbon, or hydrogen to silicon (Si). Specifically, it includes Si, SiO, SiN, SiON, SiC, SiCO, SiCN, SiCON, or the like. As described in the examples below, the formation of the etching mask film allows the thickness of the resist film to be reduced, which is advantageous in the pattern refinement. For example, if the material for the outermost surface layer of the phase-shift film 16 is to be etched with a chlorine-based gas (which may contain oxygen), the material which has a resistance to the chlorine-based gas and can be etched with the fluorine-based gas is selected for the etching mask film. If the material for the outermost surface layer of the phase-shift film 16 is to be etched with the fluorine-based gas (which may contain oxygen), the material which has a resistance to the fluorine-based gas and can be etched with the chlorine-based gas (which may contain oxygen) is selected for the etching mask film. In this case, a material which can be etched with the chlorine-based gas free of oxygen is preferably selected, in terms of thinning of the resist film.

<Reflective Mask and its Manufacturing Method>

The above-described reflective mask blank 10 of this embodiment may be used to manufacture a reflective mask. A photolithographic method which allows for high-definition patterning is most preferable for the manufacture of a reflective mask for EUV lithography.

In this embodiment, the manufacture of a reflective mask by the photolithographic method is described. An outline is described here, since the description with reference to the drawings is provided in the Examples section below.

A resist film is formed on the outermost surface of the reflective mask blank 10 (on the phase-shift film or etching mask film as described in the examples below) (which is not necessary if the reflective mask blank 10 comprises the resist film), a desired pattern is drawn on the resist film (exposure), and developing and rinsing processes are further carried out, thereby forming a predetermined resist film pattern. By performing the dry etching with an etching gas using this resist film pattern as a mask, the phase-shift film 16 is etched, and the phase-shift film pattern is formed. The etching gas may include a chlorine-based gas such as $Cl_2$, $SiCl_4$, $CHCl_3$, and $CCl_4$; a mixed gas containing the chlorine-based gas and $O_2$ in a predetermined ratio; a mixed gas containing the chlorine-based gas and He in a predetermined ratio; a mixed gas containing the chlorine-based gas and Ar in a predetermined ratio; a fluorine-based gas such as $CF_4$, $CHF_3$, $C_2F_6$, $C_3F_6$, $C_4F_6$, $C_4F_8$, $CH_2F_2$, $CH_3F$, $C_3F_8$, $SF_6$, and F; a mixed gas containing the fluorine-based gas and $O_2$ in a predetermined ratio; and an $O_2$ gas. As described in the examples below, if the phase-shift film is comprised of a laminated structure made of a plurality of materials, the etching with etching gases suitable for the respective materials will be conducted multiple times.

After removing the resist film pattern with, for example, a resist stripping solution, wet cleaning is performed using an acidic or alkaline aqueous solution, such that a reflective mask for EUV lithography, which has high reflectance, may be obtained. As described in the examples below, depending on the phase-shift film configuration, the resist film is removed when one layer in the laminated structure of the phase-shift film is etched, and thus, the step only for removing the resist film pattern may not be necessary. If the etching mask film is provided, the step of removing the etching mask film may be additionally required.

<Method for Manufacturing a Semiconductor Device>

The above reflective mask according to this embodiment is used to form, on a semiconductor substrate, a transfer pattern based on the phase-shift film pattern of the reflective mask by the lithography technique, and the other various steps are performed, such that a semiconductor device comprising various patterns, etc. formed on the semiconductor substrate may be manufactured.

Figure 6:
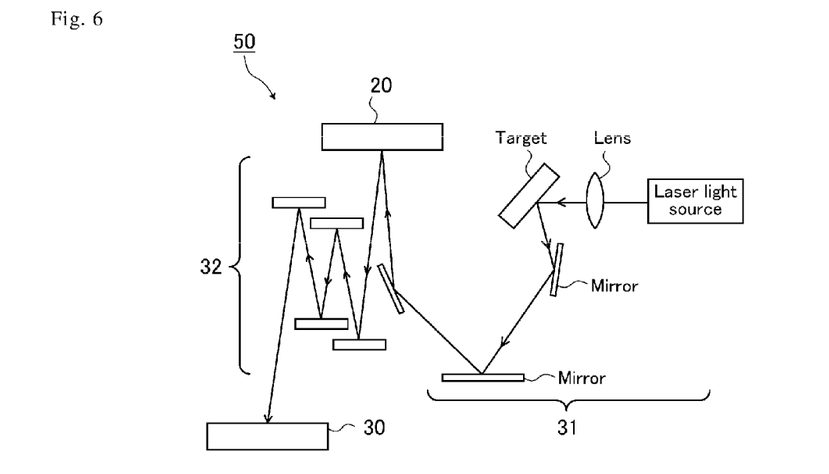
FIG. 6 is a diagrammatic view for illustrating a method for manufacturing a semiconductor device using a reflective mask for EUV lithography according to the present invention.

As a more concrete example, a method for transferring a pattern with the EUV light on the semiconductor substrate (transfer target substrate) 30 having the resist film using the reflective mask of this embodiment by a pattern transfer apparatus (exposure apparatus) 50 shown in FIG. 6 is described below.

The pattern transfer apparatus 50 equipped with the reflective mask 20 of this embodiment comprises a laser plasma X-ray source (exposure light source) 31, reflective mask 20, optical reduction system 32, etc. An X-ray reflection mirror is used as the optical reduction system 32. The laser plasma X-ray source (exposure light source) 31 used has the power of 80 W or more, in terms of normalization of a throughput.

The optical reduction system 32 causes the pattern reflected by the reflective mask 20 to be generally reduced to about one-quarter. For example, a waveband of 13 to 14 nm is used as an exposure wavelength to set an optical path to be in vacuum in advance. While in this state, the EUV light from the laser plasma X-ray source 31 is incident on the reflective mask 20, and then, the light reflected from the reflective mask 20 is transferred onto the semiconductor substrate 30 having the resist film through the optical reduction system 32 (the transfer pattern is transferred onto the resist film formed on the transfer target substrate).

At a region where the phase-shift film 16 is left, the EUV light incident on the reflective mask 20 is absorbed by the phase-shift film 16, and is not reflected. On the other hand, at a region where the phase-shift film 16 is not left, the EUV light is incident on the multilayer reflective film 13 and reflected. In this way, an image formed by the light reflected from the reflective mask 20 is incident on the optical reduction system 32, and the exposure light through the optical reduction system 32 forms the transfer pattern in a resist layer on the semiconductor substrate 30 having the resist film (some of the EUV light, which is reflected at the phase-shift film 16, is phase-shifted by 180 degrees with respect to the light reflected from the multilayer reflective film 13, thereby enhancing the contrast of the image). The exposed resist layer is developed, such that a resist pattern may be formed on the semiconductor substrate 30 having the resist film. By performing the etching, etc. using this resist pattern as a mask, a predetermined wiring pattern, for example, may be formed on the semiconductor substrate. The semiconductor device is manufactured through these and other necessary steps.

EXAMPLES

Each example is described below with reference to the drawings. Components in respective examples similar to those shown in FIG. 1 are given the same reference numerals, and their explanation is simplified or omitted.

Example 1

FIGS. 2(a) to 2(f) are schematic views illustrating respective steps for manufacturing a reflective mask for EUV lithography from a reflective mask blank for EUV lithography of Example 1.

The reflective mask blank 10 of Example 1 comprises the back side conductive film 11, substrate 12, multilayer reflective film 13, Ru-based protective film 14, anti-diffusion layer 15, and phase-shift film 16, as shown in FIG. 2(a). The phase-shift film 16 is comprised of the tantalum-based material layer 161 and chromium-based material layer 162 (which are laminated in said order from the bottom up), and the etching mask film 17 is formed on the phase-shift film 16.

((Reflective Mask Blank))

First, the mask blank 10 of Example 1 is described.

(((Back Side Conductive Film)))

The back side conductive film 11 comprising CrN was formed on a back side of the $SiO_2$—$TiO_2$-based glass substrate 12 by the magnetron sputtering method under the following conditions.

Conditions for forming the back side conductive film: Cr target, Ar+$N_2$ gas atmosphere (Ar:$N_2$:90%:N:10%), 20 nm thickness.

(((Multilayer Reflective Film)))

Next, the multilayer reflective film 13 was formed on a main surface of the substrate 12 opposite to the side where the back side conductive film 11 was formed. A Mo/Si periodic multilayer reflective film was used as the multilayer reflective film 13 formed on the substrate 12 such that the multilayer reflective film was suitable for the EUV light of 13.5 nm. The multilayer reflective film 13 was formed by alternately laminating Mo layers and Si layers on the substrate 12 by the ion beam sputtering (Ar gas atmosphere) using a Mo target and a Si target. The Si film having a thickness of 4.2 nm was formed first, and subsequently, the Mo film having a thickness of 2.8 nm was formed. These films were regarded as one period, and repeatedly laminated in 40 periods. Finally, the Si film having a thickness of 4.0 nm was formed, such that the multilayer reflective film 13 was completed.

(((Ru-Based Protective Film)))

Subsequently, an RuNb protective film 14 having a thickness of 2.5 nm was formed by the ion beam sputtering (Ar gas atmosphere) using a RuNb (Ru: 80 at %, Nb: 20 at %) target.

(((Anti-Diffusion Layer)))

Next, a surface of the Ru-based protective film 14 was treated with a highly concentrated ozone gas. The concentration of the ozone gas was 100 vol %, and the treating time was 10 minutes. Under these conditions, the substrate with the multilayer reflective film was heated to 60 degrees. This resulted in a RuO$_2$ anti-diffusion layer 15 (having a thickness of 1.0 nm) formed in the Ru-based protective film 14 on the side adjacent to the phase-shift film 16. That is, a portion of the Ru-based protective film 14 would have the function of the anti-diffusion layer 15 (the portion of 1.0 nm in thickness on a surface layer side of the Ru-based protective film 14 having the thickness of 2.5 nm would function as the anti-diffusion layer 15).

(((Phase-Shift Film)))

Then, a TaN film (tantalum-based material layer 161) and CrCON film (chromium-based material layer 162) were laminated by the DC sputtering, thereby forming the phase-shift film 16. The TaN film having a thickness of 5 nm (Ta: 92.5 at %, N: 7.5 at %) was formed by a reactive sputtering method using a tantalum target in a mixed gas atmosphere of Ar gas and N$_2$ gas. The CrCON film having a thickness of 46 nm (Cr: 45 at %, C: 10 at %, O: 35 at %, N: 10 at %) was formed by the reactive sputtering using a chromium target in a mixed gas atmosphere of Ar gas, CO$_2$ gas, and N$_2$ gas (the TaN film and CrCON film were continuously formed without exposure to the atmosphere).

For the respective TaN film and CrCON film formed as above, the refractive index n and extinction coefficient k at a wavelength of 13.5 nm were as follows:
TaN: n→0.94, k→0.034
CrCON: n→0.93, k→0.037.

The respective thickness of the above TaN film and CrCON film was set such that the reflectance was 2% and the phase difference was 180 degrees at the wavelength of 13.5 nm.

(((Etching Mask Film)))

Then, a SiO$_2$ film having a thickness of 5 nm was formed as the etching mask film 17 on the phase-shift film 16 by the RF sputtering.

The above process resulted in the reflective mask blank 10 of Example 1. Incidentally, for the reflective mask blank (without the etching mask film) manufactured by the manufacturing method similar to the above, the EUV light reflectance of the phase-shift film surface measured 2.5%. Next, for an evaluation of usage environment assuming that the power of the exposure light source was high, a heating treatment was performed at 80° C. for one hour in vacuum, and the EUV light reflectance of the phase-shift film surface after the heating treatment was measured. As a result, the reflectance was 2.4%, i.e., virtually unchanged. This would be because the thermal diffusion between the Ru-based protective film 14 and phase-shift film 16 was inhibited by the anti-diffusion layer 15. That is, since the formation of the anti-diffusion layer 15 according to the present invention inhibits the thermal diffusion between the protective film and phase-shift film even under the usage environment where the power of the exposure light source is high, the reduction in the EUV light reflectance may be inhibited, and thus, the reflective mask with the reduction in phase effect being inhibited may be obtained.

In order to exhibit an effect of preventing the thermal diffusion, it is more preferable that the tantalum-based material layer 161 is formed adjacent to the anti-diffusion layer 15 as shown in this example. Further, also in the manufacture of the reflective mask from the reflective mask blank described below, the tantalum-based material layer 161 is formed adjacent to the anti-diffusion layer 15, such that patterning of the tantalum-based material layer 161 causes little damage to the protective film/anti-diffusion film, and the reflective mask with a high reflectance may be obtained, which is preferable. This is because if the chromium-based material layer 162 is formed adjacent to the anti-diffusion layer 15, the etching gas used for patterning the chromium-based material layer 162, which is a mixed gas of chlorine and oxygen (Cl$_2$+O$_2$), erodes the Ru-based protective film.

The phase-shift film 16 is formed as a laminated film which is continuously formed by the sputtering method without exposure to the atmosphere from the beginning to the end of film formation as shown in this example, thereby preferably preventing an oxidized layer (tantalum oxide layer) from being formed on a surface of the tantalum-based material layer 161. That is, if the tantalum-based material layer is included as a material for the phase-shift film, the tantalum oxide layer is formed on the surface of the tantalum-based material layer upon its exposure to the atmosphere. The tantalum oxide layer is not preferable since it cannot be etched unless the fluorine-based gas is used as an etching gas, and it complicates the process (the chromium-based material layer can be etched with the mixed gas of chlorine and oxygen even if its surface is oxidized). However, this example may overcome this problem. From a similar perspective, the outermost surface layer of the phase-shift film 16 is preferably the chromium-based material layer (the chromium-based material layer as the outermost surface layer has a function as an anti-oxidation layer).

((Reflective Mask))

Next, the above reflective mask blank 10 was used to manufacture the reflective mask 20.

Figure 2:
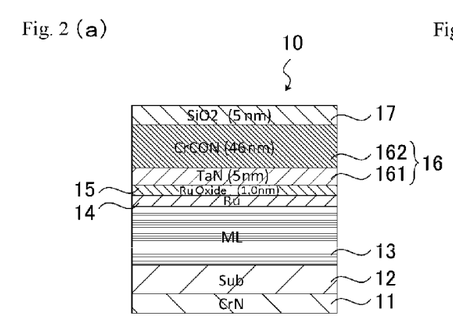
FIGS. 2(a) to 2(f) are schematic views illustrating respective steps for manufacturing a reflective mask for EUV lithography from a reflective mask blank for EUV lithography of Example 1.
Figure 3:
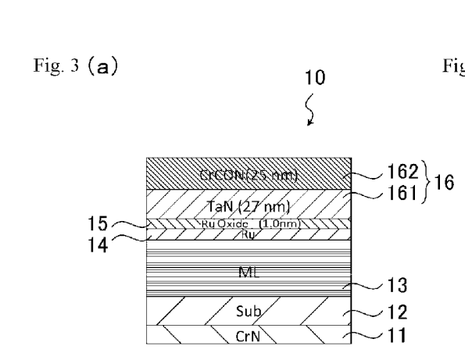
FIGS. 3(a) to 3(e) are schematic views illustrating respective steps for manufacturing a reflective mask for EUV lithography from a reflective mask blank for EUV lithography of Example 2.

A resist film 18 having a thickness of 40 nm is formed on the etching mask film 17 of the reflective mask blank 10 (FIG. 2(*b*)), a desired pattern is drawn on the resist film (exposure), and developing and rinsing processes are further carried out, thereby forming a predetermined resist film pattern 18*a*. The SiO$_2$ film is dry etched with the fluorine-based gas (CF$_4$ gas) using this resist film pattern 18*a* as a mask, thereby forming an etching mask film pattern 17*a* (FIG. 2(*c*)). Subsequently, the CrCON film (chromium-based material layer 162) is dry etched with a mixed gas of Cl$_2$ and O$_2$ (hereinafter referred to as simply "Cl$_2$+O$_2$ gas") using the resist film pattern 18*a* and etching mask film pattern 17*a* as a mask (FIG. 2(*d*)). After that, the TaN film (tantalum-based material layer 161) is dry etched with a Cl$_2$ gas. As a result, the phase-shift film pattern 16*a* is formed (FIG. 2(*e*)). Finally, the etching mask film pattern 17*a* is removed with the fluorine-based gas (CF$_4$ gas), thereby completing the reflective mask 20 (FIG. 2(*f*)). The resist film 18 is removed during the dry etching with the Cl$_2$+O$_2$ gas (etching of the chromium-based material layer 162).

In the reflective mask 20 of this example, since the thermal diffusion between the protective film and phase-shift film is inhibited even under the usage environment where the power of the exposure light source is high, as described above, the reduction in the EUV light reflectance is inhibited, and thus, the reduction in phase effect is also inhibited even in repeated use. Therefore, the stable semiconductor device may be manufactured, which is highly beneficial. In the reflective mask 20 of this example, since the outermost surface layer is the chromium-based material layer 162 containing carbon, it is useful in terms of the mask cleaning resistance (resistance to a cleaning fluid for removing residual carbon (e.g., acidic cleaning fluid)). Since the reflective mask is generally used under an environment with no pellicle, and the residual carbon adheres to the reflective mask during its use (in vacuum), the resistance to the cleaning fluid for removing the residual carbon is necessary. The chromium-based material layer may further contain oxygen, nitrogen, hydrogen, etc.

Further, in the reflective mask 20 of this example, since the etching mask film 17 is formed on the phase-shift film 16, the resist film 18 for forming the transfer pattern may be thinner, such that a reflective mask having a fine pattern may be obtained. That is, without the etching mask film 17, when etching the chromium-based material layer 162 (FIG. 2(c)→FIG. 2(d)), the resist film pattern 18a is also etched with the $Cl_2+O_2$ gas containing $O_2$, and thus, the resist film 18 should be thick (generally, the resist layer should be about three times thicker than the Cr layer). However, if the resist film pattern 18a is excessively high, it may collapse. Therefore, a thinner pattern is necessary for achieving a fine pattern. In this example, since the etching mask film 17, which has etching selectivity with respect to the material of the outermost surface layer of the phase-shift film 16, is formed, the resist film 18 may be thinned.

Example 2

FIGS. 3(a) to 3(e) are schematic views illustrating respective steps for manufacturing a reflective mask for EUV lithography from a reflective mask blank for EUV lithography of Example 2.

The reflective mask blank and reflective mask in Example 2 were manufactured respectively in a manner similar to Example 1, except that the TaN film (tantalum-based material layer 161) and CrCON film (chromium-based material layer 162) of the phase-shift film had the thickness of 27 nm and 25 nm, respectively, and no etching mask film was formed in comparison to Example 1 (if the chromium-based material layer 162 had a certain thickness or less, the resist film 18 made thicker could compensate for the lack of the etching mask film (the resist film 18 was formed to have a thickness of 80 nm in this example)). Thus, while the step for etching the etching mask film with the fluorine-based gas was not necessary, the step for finally etching the resist film pattern 18a with an oxygen-based gas was necessary (FIG. 3(d)→FIG. 3(e)). The thickness of the above TaN film (tantalum-based material layer 161) and CrCON film (chromium-based material layer 162) was set such that the reflectance was 2% and the phase difference was 180 degrees at a wavelength of 13.5 nm.

In the reflective mask blank (without the etching mask film) manufactured in a manner similar to the above, the EUV light reflectance of the phase-shift film surface measured 2.2%. Next, for an evaluation of usage environment assuming that the power of the exposure light source was high, a heating treatment was performed at 80° C. for one hour in vacuum, and the EUV light reflectance of the phase-shift film surface after the heating treatment was measured. As a result, the reflectance was 2.3%. As with Example 1, a virtually unchanged reflectance was the result.

Example 3

FIGS. 4(a) to 4(f) are schematic views illustrating respective steps for manufacturing a reflective mask for EUV lithography from a reflective mask blank for EUV lithography of Example 3.

Figure 4:
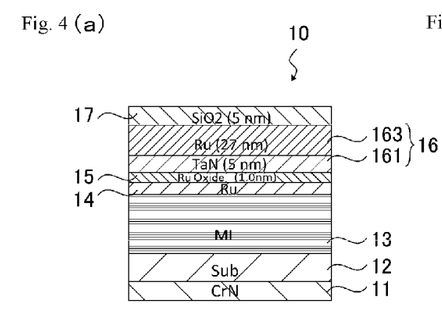
FIGS. 4(a) to 4(f) are schematic views illustrating respective steps for manufacturing a reflective mask for EUV lithography from a reflective mask blank for EUV lithography of Example 3.

While the phase-shift film 16 in Example 1 is comprised of the TaN film (tantalum-based material layer 161) and CrCON film (chromium-based material layer 162), the phase-shift film 16 in Example 3 was formed by laminating the TaN film (tantalum-based material layer 161) and Ru film (ruthenium-based material layer 163) in said order, which had a thickness of 5 nm and 27 nm, respectively.

The phase-shift film 16 was formed by laminating the TaN film (tantalum-based material layer 161) and Ru film (ruthenium-based material layer 163) by the DC sputtering. The TaN film having the thickness of 5 nm (Ta: 92.5 at %, N: 7.5 at %) was formed by the reactive sputtering method using the tantalum target in the mixed gas atmosphere of Ar gas and $N_2$ gas. The Ru film having the thickness of 27 nm was formed by the sputtering using the ruthenium target in the Ar gas atmosphere (the TaN film and Ru film were continuously formed without exposure to the atmosphere).

For the respective TaN film and Ru film formed as above, the refractive index n and extinction coefficient k at a wavelength of 13.5 nm were as follows:
TaN: n→0.94, k→0.034
Ru: n→0.888, k→0.017.

The respective thickness of the above TaN film and Ru film was set such that the reflectance was 26% and the phase difference was 180 degrees at the wavelength of 13.5 nm.

In the reflective mask blank (without the etching mask film) manufactured in a manner similar to the above, the EUV light reflectance of the phase-shift film surface measured 25.9%. Next, for an evaluation of usage environment assuming that the power of the exposure light source was high, a heating treatment was performed at 80° C. for one hour in vacuum, and the EUV light reflectance of the phase-shift film surface after the heating treatment was measured. As a result, the reflectance was 25.8%. As with Example 1, a virtually unchanged reflectance was the result.

Regarding the manufacture of the reflective mask from the reflective mask blank in Example 3, the Ru film (ruthenium-based material layer 163) was used instead of the CrCON film (chromium-based material layer 162) in the phase-shift film of Example 1. Thus, while Example 3 was different from Example 1 in that the Ru film was dry etched with the $O_2$ gas during the etching using the resist film pattern 18a and etching mask film pattern 17a as a mask (FIGS. 4(c)→4(d)), the other aspects were the same as Example 1. The resist film 18 is removed during the dry etching of the Ru film with the $O_2$ gas.

According to Example 3, since the Ru film (ruthenium-based material layer 163) is used in the phase-shift film 16, the total thickness of the phase-shift film 16 may be thinner (the phase-shift film has a thickness of 58 nm in Comparative Example below, 51 nm in Example 1, and 52 nm in Example 2, whereas it has a thickness of 32 nm in this example, and 40 nm in Example 4). Therefore, the reflective mask and reflective mask blank with a small shadowing effect may be beneficially provided.

Example 4

FIGS. 5(a) to 5(f) are schematic views illustrating respective steps for manufacturing a reflective mask for EUV lithography from a reflective mask blank for EUV lithography of Example 4.

Figure 5:
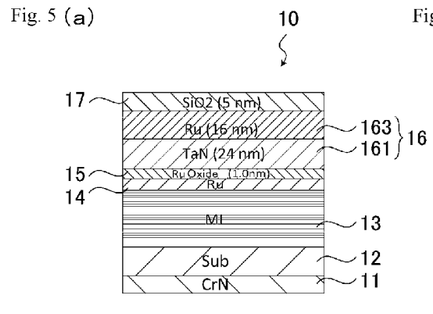
FIGS. 5(a) to 5(f) are schematic views illustrating respective steps for manufacturing a reflective mask for EUV lithography from a reflective mask blank for EUV lithography of Example 4.

The reflective mask blank and reflective mask in Example 4 were manufactured respectively in a manner similar to Example 3, except that the TaN film (tantalum-based material layer 161) and Ru film (ruthenium-based material layer 163) of the phase-shift film had the thickness of 24 nm and 16 nm, respectively, in comparison to Example 3. The thickness of the above TaN film and Ru film was set such that the reflectance was 6% and the phase difference was 180 degrees at a wavelength of 13.5 nm.

In the reflective mask blank (without the etching mask film) manufactured in a manner similar to the above, the EUV light reflectance of the phase-shift film surface measured 6.2%. Next, for an evaluation of usage environment assuming that the power of the exposure light source was high, a heating treatment was performed at 80° C. for one hour in vacuum, and the EUV light reflectance of the phase-shift film surface after the heating treatment was measured. As a result, the reflectance was 6.1%. As with Example 1, a virtually unchanged reflectance was the result.

Example 5

The reflective mask blank and reflective mask in Example 5 were manufactured respectively in a manner similar to Example 1, except that the Ru protective film 14 having a thickness of 1.5 nm was formed by the DC sputtering using the Ru target in the Ar gas atmosphere, and the $RuO_2$ anti-diffusion film 15 (compositional ratio: Ru:O=1:2) having a thickness of 1.0 nm was then formed by the DC sputtering using the Ru target in the $Ar+O_2$ mixed gas atmosphere, in comparison to Example 1.

In the reflective mask blank (without the etching mask film) manufactured in a manner similar to the above, the EUV light reflectance of the phase-shift film surface measured 2.0%. Next, for an evaluation of usage environment assuming that the power of the exposure light source was high, a heating treatment was performed at 80° C. for one hour in vacuum, and the EUV light reflectance of the phase-shift film surface after the heating treatment was measured. As a result, the reflectance was 2.1%. As with Example 1, a virtually unchanged reflectance was the result.

Respective examples are described above. Comparative Example for the above examples according to the present invention is described below.

Comparative Example

FIGS. 7(a) to 7(d) are schematic views illustrating respective steps for manufacturing a reflective mask for EUV lithography from a conventional reflective mask blank for EUV lithography, as a comparative example.

Figure 7:
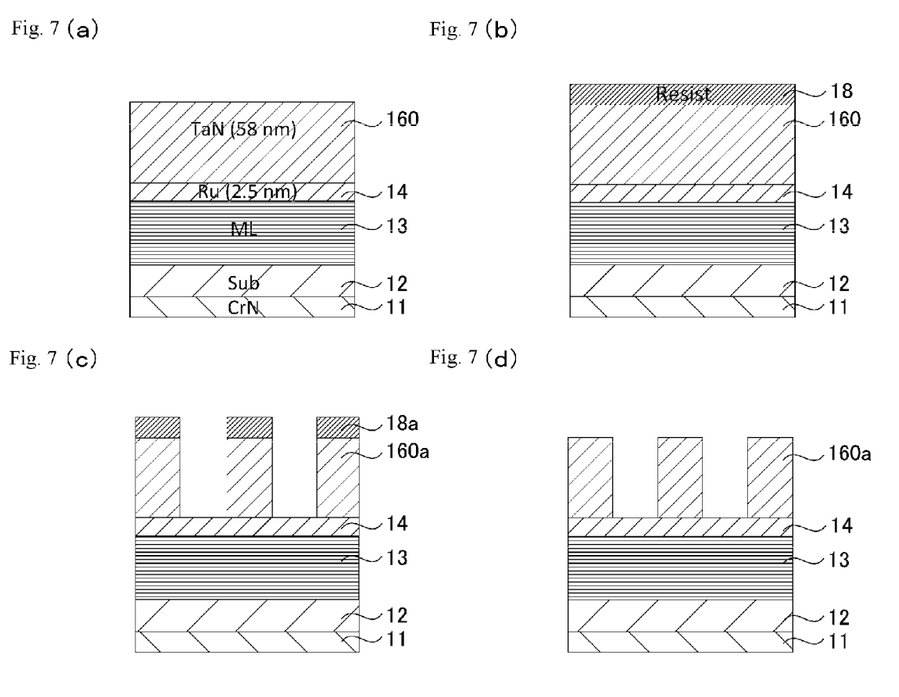
FIGS. 7(a) to 7(d) are schematic views illustrating respective steps for manufacturing a reflective mask for EUV lithography from a conventional reflective mask blank for EUV lithography, as a comparative example.

In Comparative Example, the anti-diffusion layer according to the present invention was not formed. That is, the TaN film (phase-shift film 160) having a thickness of 58 nm was formed by the DC sputtering, without providing the anti-diffusion layer 15 on the Ru-based protective film 14 (or as a part of the Ru-based protective film 14) of the above examples. The thickness of the TaN film was set such that the reflectance was 3% and the phase difference was 180 degrees.

In the reflective mask blank manufactured in a manner similar to the above, the EUV light reflectance of the phase-shift film surface measured 3.4%. Next, for an evaluation of usage environment assuming that the power of the exposure light source was high, a heating treatment was performed at 80° C. for one hour in vacuum, and the EUV light reflectance of the absorber film surface after the heating treatment was measured. As a result, the reflectance was 1.8%. That is, the reflectance decreased from 3.4% to 1.8% in Comparative Example. It indicates that the function as designed cannot be obtained (the phase-shift effect will be reduced) under the usage environment where the power of the exposure light source is high.

As described above, in the reflective mask blank (and the reflective mask manufactured therefrom) of Examples, the anti-diffusion layer 15 comprising ruthenium and oxygen is formed on the Ru-based protective film 14 on the side adjacent to the phase-shift layer 16. Therefore, even under the usage environment where the power of the exposure light source of the EUV exposure machine is high, the thermal diffusion between the protective film and phase-shift film (absorber film) is inhibited, thereby inhibiting the reduction in EUV light reflectance, such that the reduction in phase-shift effect is inhibited even if the reflective mask is repeatedly used (a significant difference from conventional cases has been obtained). While the sum of thickness from the resist film to phase-shift film was 158 nm (resist film: 100 nm, phase-shift film: 58 nm) in Comparative Example, it may be reduced in Examples (Example 1: 96 nm (resist film: 40 nm, etching mask film: 5 nm, phase-shift film: 51 nm); Example 2: 132 nm (resist film: 80 nm, phase-shift film: 52 nm); Example 3: 77 nm (resist film: 40 nm, etching mask film: 5 nm, phase-shift film: 32 nm); Example 4: 85 nm (resist film: 40 nm, etching mask film: 5 nm, phase-shift film: 40 nm)), which is advantageous in the fine pattern formation.

Incidentally, the uppermost layer of the multilayer reflective film 13 may be made of silicon (Si), and a silicon oxide layer comprising silicon and oxygen may be formed between the uppermost layer (Si) and Ru-based protective film 14. In the conventional reflective mask, the protective film is provided on the multilayer reflective film; Si diffuses into the Ru-based protective film between the Si layer and protective film; silicon oxide is further formed due to the oxidation; and repeated cleaning is applied in the manufacturing steps of the reflective mask or during use after the product is finished, thereby causing the film peeling. On the other hand, the silicon oxide layer comprising silicon and oxygen is formed between Si as the uppermost layer of the multilayer reflective film 13 and the Ru-based protective film 14, and thus, the diffusion between the uppermost layer of the multilayer reflective film 13 and Ru-based protective film 14 may be inhibited, which inhibits the reduction in EUV light reflectance and improves the mask cleaning resistance (resistance to film peeling in the phase-shift film pattern). The thickness of the silicon oxide layer is preferably 0.2 nm or more from the viewpoint of inhibition of transition of Si to the protective film. It is also preferably 3 nm or less from the viewpoint of inhibition of reduction in EUV light reflectance. Its more preferable range based on the both viewpoints is 0.5 to 2 nm. The silicon oxide layer may be formed by the ion beam sputtering method, sputtering method, CVD, vacuum deposition method, etc. Also, by annealing silicon (Si) that is the uppermost layer of the multilayer reflective film 13, the silicon oxide layer may be formed on a surface layer of the uppermost silicon layer.

REFERENCE NUMERALS

10: reflective mask blank
12: substrate
13: multilayer reflective film
14: Ru-based protective film
15: anti-diffusion layer
16: phase-shift film
17: etching mask film
18: resist film
30: semiconductor substrate (transfer target substrate) having a resist film
31: laser plasma X-ray source (exposure light source)
50: pattern transfer apparatus (exposure apparatus)
161: tantalum-based material layer
162: chromium-based material layer

What is claimed is:
1. A reflective mask blank comprising:
a substrate, and
a multilayer reflective film, a protective film, and a phase-shift film for shifting a phase of EUV light, which are formed in said order on the substrate,
wherein the protective film is made of a material containing ruthenium as a main component, wherein the phase-shift film has a tantalum-based material layer comprising tantalum, and wherein an anti-diffusion layer comprising ruthenium and oxygen is formed on a surface of the protective film, or as a part of the protective film on a side adjacent to the phase-shift film, so as to inhibit counter diffusion in relation to the phase-shift film.

2. The reflective mask blank according to claim 1, wherein the tantalum-based material layer is adjacent to the anti-diffusion layer.

3. The reflective mask blank according to claim 1, wherein a thickness of the anti-diffusion layer is not less than 0.2 nm and not more than 1.5 nm.

4. The reflective mask blank according to claim 1, wherein the phase-shift film is formed in a laminated structure, and has a chromium-based material layer as an outermost surface layer.

5. The reflective mask blank according to claim 4, wherein the chromium-based material layer comprises carbon.

6. The reflective mask blank according to claim 1, wherein the phase-shift film is formed in a laminated structure, and has a ruthenium-based material layer as an outermost surface layer.

7. The reflective mask blank according to claim 1, wherein the phase-shift film is formed by a sputtering method, and has a laminated structure formed continuously without exposure to the atmosphere from the beginning to the end of film formation.

8. The reflective mask blank according to claim 1, wherein an etching mask film is formed on the phase-shift film.

9. The reflective mask blank according to claim 1, wherein an uppermost layer of the multilayer reflective film is silicon (Si), and a silicon oxide layer comprising silicon and oxygen is provided between the uppermost layer and the protective film.

10. A reflective mask manufactured from the reflective mask blank according to claim 1.

11. A method for manufacturing a semiconductor device, comprising the step of:

setting the reflective mask according to claim 10 on an exposure apparatus having an exposure light source for emitting EUV light, so as to transfer a transfer pattern onto a resist film formed on a transfer target substrate.

12. The method for manufacturing a semiconductor device according to claim 11, wherein the power (electric power) of the exposure light source is 80 W or more.

* * * * *